United States Patent [19]

Mushya et al.

[11] Patent Number: 5,596,535
[45] Date of Patent: Jan. 21, 1997

[54] SEMICONDUCTOR STORAGE DEVICE

[75] Inventors: Tathunori Mushya, Fuchu; Masayasu Kawamura, Kodaira; Shunichi Sukegawa, Tsukuba, all of Japan

[73] Assignee: Texas Instruments Incorporated, Dallas, Tex.

[21] Appl. No.: 267,267

[22] Filed: Jun. 28, 1994

[30] Foreign Application Priority Data

Jun. 28, 1993 [JP] Japan .................................. 5-181957

[51] Int. Cl.$^6$ .................................. G11C 7/00; G11C 8/00
[52] U.S. Cl. ................. 365/200; 365/225.7; 365/230.06; 365/185.09
[58] Field of Search ................................. 365/200, 225.7, 365/230.06, 185.09

[56] References Cited

U.S. PATENT DOCUMENTS

| | | | |
|---|---|---|---|
| 5,140,554 | 8/1992 | Schreck et al. | 365/225.7 |
| 5,282,165 | 1/1994 | Miyake et al. | 365/200 |
| 5,293,339 | 5/1994 | Suzuki et al. | 365/200 |
| 5,293,564 | 3/1994 | Sukegawa et al. | 365/200 |
| 5,337,278 | 8/1994 | Cho | 365/200 |
| 5,375,090 | 12/1994 | Yoshida | 365/200 |

*Primary Examiner*—David C. Nelms
*Assistant Examiner*—Trong Phan
*Attorney, Agent, or Firm*—Lawrence J. Bassuk; William E. Hiller; Richard L. Donaldson

[57] ABSTRACT

A semiconductor storage device equipped with redundant circuits designed to increase the operating speed and to simplify the layout by providing for the detection of the storage of a faulty address and access to the faulty address so as to substitute a spare word line for a faulty word line. The semiconductor storage device includes a MOSFET for causing current to flow through a pair of fuse means by a complementary address signal at one end of a fuse means corresponding to each bit of the faulty address. The other end thereof is connected to a wired OR logic so as to generate a decision signal. The fuse means corresponding to the MOSFET which is turned on by the faulty address signal is cut off to store a faulty address. The faulty address storage and comparison units can be formed with the pair of fuses and the MOSFET. High-speed operation and a high-density layout in the form of a matrix can thus be achieved efficiently by switching the faulty circuit to a spare circuit while the normal decoder is operating.

1 Claim, 3 Drawing Sheets

SEMICONDUCTOR STORAGE DEVICE

The present invention relates to a semiconductor storage device and technology effectively applicable to a redundant circuit for detecting the storage of a faulty address and access to the faulty address in, for example, a dynamic RAM (Random Access Memory).

BACKGROUND OF THE INVENTION

There is a dynamic RAM which is designed to redress faulty bits or faulty data lines by providing spare word or bit lines (which may also be called data or digit lines). For example, in Japanese laid-open Patent Application No. 214699/1991 the art of redressing the defects of such a dynamic RAM is described.

In the case of conventional dynamic RAMs, any defect is redressed through the steps of forming a complementary faulty address signal corresponding to the cutting of a fuse means or the like to store a faulty address, causing a comparator to compare the faulty address signal with an address signal inputted due to memory access, and switching, for example, the faulty word line to a spare word line. In this arrangement, an address of a state that the fuse has not yet been cut is regarded as a faulty one even when no fault exists and a spare circuit is activated. Consequently, an enable signal is generated to judge whether or not a faulty address has been stored and to bring the output of the result of a comparison with the faulty address in effect.

In this arrangement, the spare circuit needs to be activated after access to the faulty address is detected. Therefore, the operation access to the memory is slowed. Moreover, the mixture of the faulty address storage part such as the fuse means, the faulty-address reading means and the address comparing means inevitably complicates the layout of the circuits. Consequently, there arises a problem that a relatively large area occupied by the circuit arrangement is necessary.

An object of the present invention is to provide a semiconductor storage device having a redundant circuit designed to increase the operational speed and to simplify the system layout.

Other objects and novel features of the present invention will become more apparent by referring to the following description and appended drawings.

SUMMARY OF THE INVENTION

A semiconductor storage device according to the present invention comprises a pair of fuse means provided in correspondence to each bit of a faulty address, MOSFETs provided at one end of each fuse means and used for supplying the fuse means with electric current according to a complementary address signal, the other end thereof being connected to a wired OR logic arrangement to form a faulty address decision signal, and a redundant circuit for storing the faulty address by cutting off the fuse means corresponding to the MOSFET which is turned on by a faulty address signal.

In providing such a semiconductor storage device, a comparator means and a unit faulty address storage can be defined by the pair of fuse means and MOSFETs and high-speed operation is possible by switching the faulty unit to a spare circuit in parallel to the operation of a normal decoder. In addition, they can be arranged in the form of a high-density matrix with efficiency.

Figure 1:
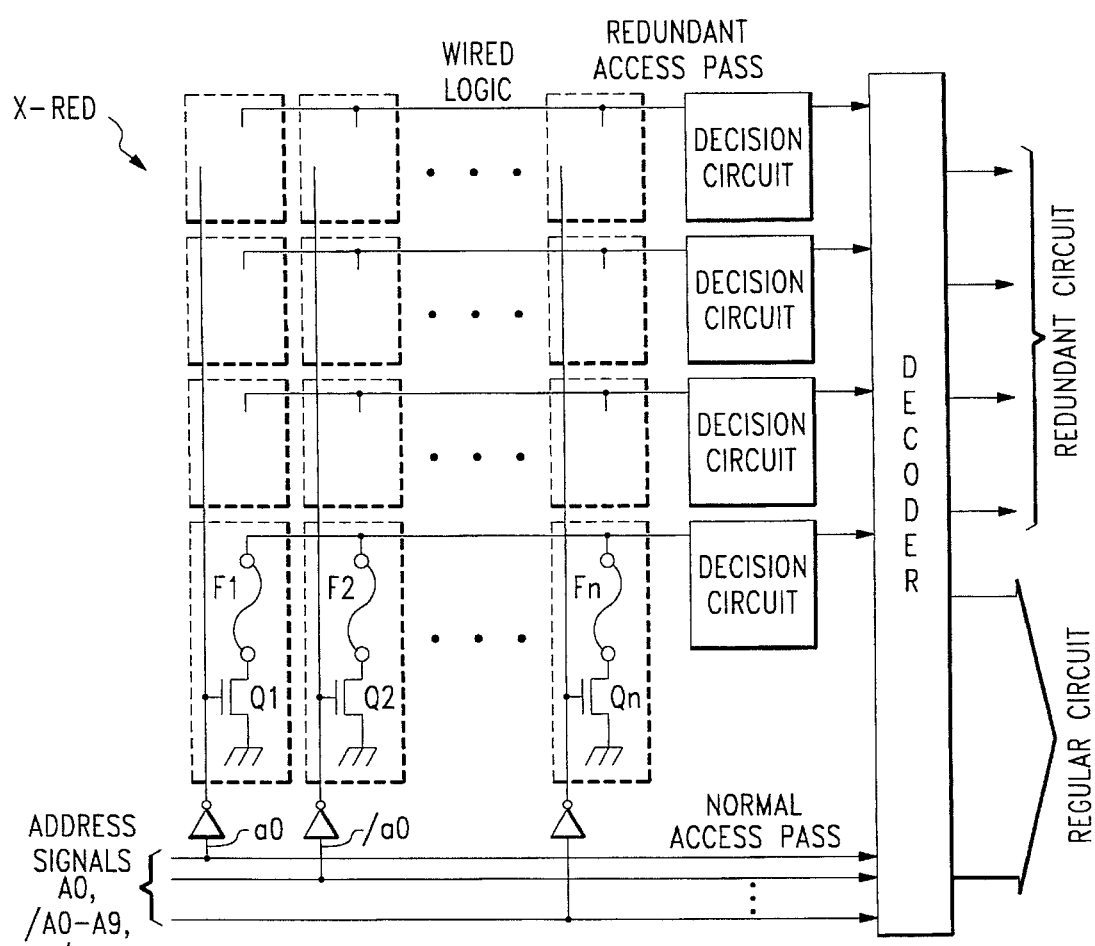
FIG. 1 is a partially schematic block diagram showing an embodiment of a redundant circuit according to the present invention.

Reference numerals and symbols as shown in the drawings:

MAT0–MAT7 ... memory mats, MARY0, MARY1 ... memory arrays, XD0–XD7 ... decoder circuits, WD0–WD7 ... word drivers, SA01–SA67 ... sense amplifiers, YD ... column decoder circuit, MATCTRL0–MATCTRL3 ... mat control circuits, TG ... timing control circuit, I/O ... input/output circuit, RAB ... row address buffer, CAB ... column address buffer, AMX ... multiplexer, RFC ... refresh address counter circuit, XPD, YPD ... predecoder circuits, X-DEC ... redundant circuit of the row system, XIB ... decoder circuit.

DESCRIPTION OF PREFERRED EMBODIMENTS

FIG. 1 illustrates a first embodiment of a redundant circuit diagram in accordance with the present invention. The redundant circuit elements are employed with other circuits to comprise a dynamic RAM on one semiconductor substrate such as monocrystalline silicon as shown in FIG. 1.

In this embodiment, four exemplary redundant circuits are shown and a schematic diagram of one of the redundant circuits is shown by way of example, whereas the other three circuits are shown by respective boxes drawn by dashed lines. The representative redundant circuit has units of a MOSFET Q1 and a fuse means F1 and the number of units corresponds to the number of complementary address signals. For example, when 10-bit address signals A0–A9 are used to select one word line of a normal dynamic RAM, there are provided 20 unit circuits corresponding to inverted and non-inverted 20-bit complementary address signals with respect to the above address signals.

The redundant circuits comprising MOSFETs Q1–Qn and fuse means F1–F1n, respectively, are arranged in parallel with the address signal lines. The drains of the MOSFETs Q1–Qn are connected to the respective fuse means F1–Fn at one end thereof respectively and the sources of the MOSFETs Q1–Qn are connected to ground potential of the circuits. Further, the complementary address signals are supplied via inverter circuits serving as buffer circuits to the gates of respective MOSFETs Q1–Qn. The other ends of the fuse means F1–Fn are connected to a wired logic arrangement and connected to the inputs of decision circuits.

The decision circuits are each formed of, though not necessarily limited to, a voltage decision circuit such as a CMOS inverter circuit whose input is equipped with, for example, a pull-up resistor. When no current path is formed in any one of the unit circuits F1, Q1,–Fn, Qn, each comprising a fuse means and a MOSFET, the pull-up resistor causes a high-level signal to be supplied to the decision circuits, so that the selection of the redundant circuit is made. When the current path is formed in any one of the unit circuits F1, Q1–Fn, Qn, the input signal to the judging circuit is changed to a low level and the redundant circuit is not selected.

A faulty address is stored as follows. The fuse means corresponding to the high level of a signal out of the complementary address signals are cut off, but the fuse means corresponding to the low level are not cut off. Assuming that the pair of fuse means F1 correspond to a non-inverted address signal a0 and the fuse means F2 correspond to an inverted address signal/a0 ("/" in this case means a bar signal), the fuse means F1 corresponding to the non-inverted address signal a0 that has been inverted by the buffer circuit is cut off, whereas the fuse means F2 corresponding to the non-inverted address signal/a0 is not cut off. In the same manner, any ones of the paired fuse means corresponding to faulty addresses A1–An are cut off in response to the output signal of the buffer circuit.

The fuse means are selectively cut off by, though not limited to, applying an energy beam such as a laser beam to the fuse means made of a polysilicon layer or a thin aluminum wire.

When the faulty address is thus stored and when the address signal A0 is changed to a low level due to access to the memory, the MOSFET Q1 is turned on because of the high level of the non-inverted address signal a0 passed through the buffer circuit, and the MOSFET Q2 is turned off because of the low level of the inverted address signal/a0. Since the fuse means F1 corresponding to the MOSFET Q1 in the ON state is cut off, no current path is formed. Since the MOSFET corresponding to the fuse means F2 which remains uncut is in the OFF state, no current path is formed. When the address signal A0 is changed to a low level due to access to the memory, the MOSFET Q1 is turned off because of the low level of the non-inverted address signal a0 passed through the buffer circuit, whereas the MOSFET Q2 is turned on because of the high level of the inverted address signal/a0. As the fuse means F2 corresponding to the MOSFET Q2 in the ON state is not cut off, a current path is formed. Thus the two pairs of fuse means F1, F2 and MOSFET Q1, Q2 perform address comparison on the basis of storing of the faulty address and the wired logic.

When no current is generated with respect to the other address signals A1 to An, a high-level signal is generated according to the wired logic, and the decision circuit decides whether any access to the faulty address has been made. If there is any discord bit among the other address signals A1 to An, the decision circuit causes the redundant circuit to be unselected with the current path.

The output of the result of a decision based on the wired logic can be made together with the address selecting operation performed by the decoder. In other words, if even one current path is formed, the result of a decision that the redundant circuit is unselected is immediately outputted. Therefore, according to the fact that the output signal of the decision circuit is an unselected output, the decoder circuit corresponding to the normal circuit makes the output effective and selects the normal circuit. When the decision circuit detects access to the faulty address, the output is used as the signal for selecting the redundant circuit and the output of the decoder is made ineffective so as to prohibit the selecting operation with respect to the normal circuit.

In this arrangement, since the redundant circuit can detect access to the faulty address by use of the logic circuit of one stage by wired logic, it can operate at a speed higher than that of the logic stage of the decoder circuit for selection of a number of word or data lines. It is substantially unnecessary to adjust the timing at which the decoder does not select the normal circuit until the output of the decision circuit is determined. Consequently, access to the memory at high speed is possible. Practically, the timing adjustment above seldom delays the selection performed by the decoder.

While there is no defect on the normal circuit side, the fuse means is not cut off. Even in this case, the specific address in the normal circuit is not switched to the redundant circuit as a faulty address. When no fuse means is cut off as set forth above, half the MOSFETs (n/2) receiving the high-level output signals of the buffer circuits among the address signals A0–An are turned on and the current paths are formed with the uncut fuse means. Therefore the redundant circuits are not selected. Unlike conventional redundant circuits, the fuse means for the enable signal representing the written faulty address can be omitted.

In this embodiment, the output line of the buffer circuit is extended to cross a fuse train perpendicularly so that the layout of redundant circuits may be effected efficiently. In other words, the other three redundant circuits are vertically stacked on the circuit exemplarily shown above. In other words, address lines as the output lines of the buffer circuits cross the wired logic output lines perpendicularly, and the unit circuits, each comprising the fuse means and MOSFET, are arranged in the form of a matrix. In this arrangement, it is possible to reduce the redundant circuit layout area by a large extent because the redundant circuits can be arranged in an array form.

Incidentally, a conventional circuit may have a latch circuit for forming a faulty address signal according to whether or not the fuse means for storing a faulty address is cut, a circuit for forming the complementary faulty address signal based on the output of the latch circuit, and an address comparator. Accordingly, it is naturally a random logic circuit, thus making it impossible to establish an efficient layout of the device including the fuse means. Moreover, the address comparison is slow because a plurality of logical stages are used.

Figure 2:
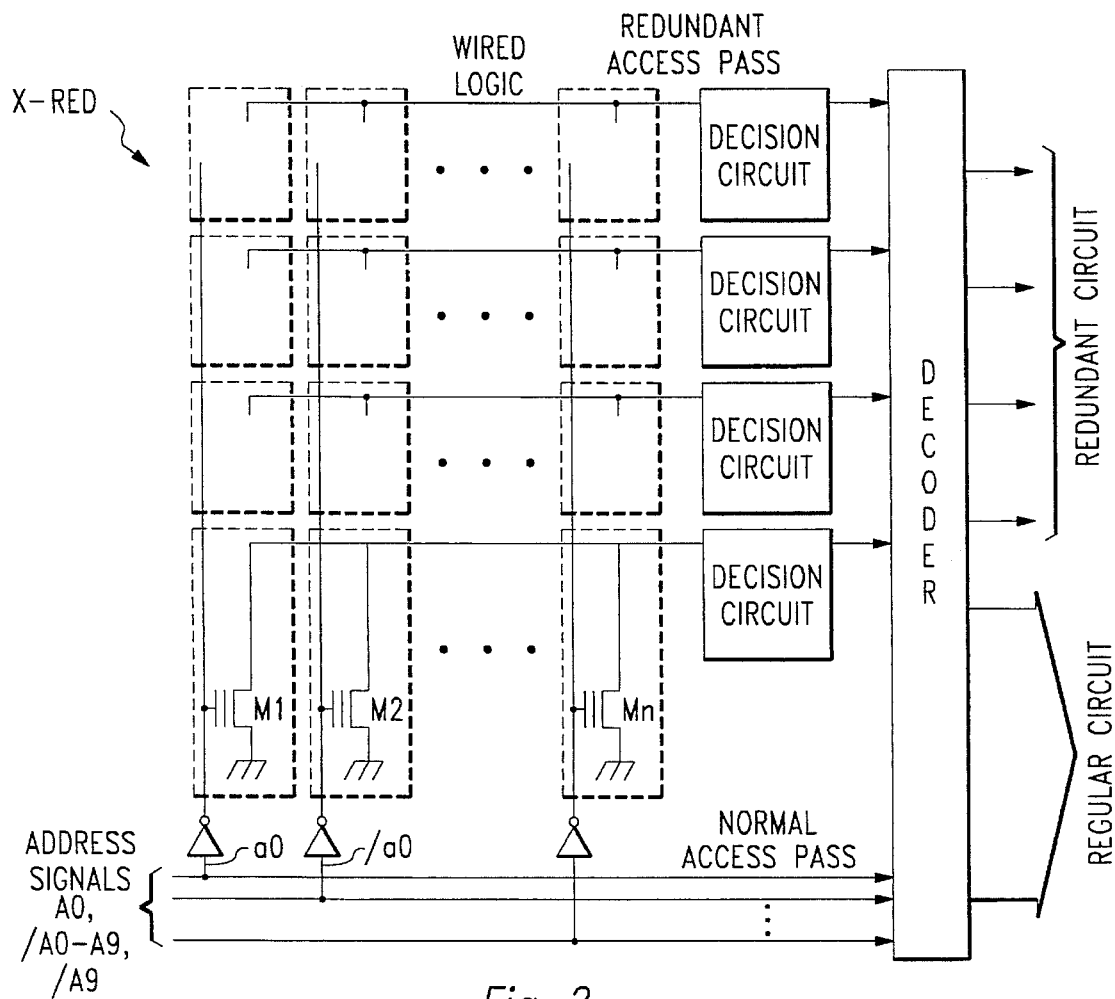
FIG. 2 is a partially schematic block diagram showing another embodiment of a redundant circuit according to the present invention.

FIG. 2 shows another embodiment of a redundant circuit diagram in accordance with the present invention. In this embodiment, the fuse means F and MOSFETs Q of FIG. 1 are replaced with nonvolatile storage elements M1–Mn, the rest of the structure remaining the same as shown in FIG. 1. The nonvolatile storage elements M1–Mn are stacked gate structures comprising floating and control gates. In this case, storage elements used in EPROMs are utilized; however, the provision of erase windows, that is, the erase function is omitted because erasure as in the case of an EPROM is unnecessary.

When electric charge is injected into the floating gates, the threshold voltage in the nonvolatile storage elements M1–Mn is raised. In other words, the storage element is caused to have such a threshold voltage that it is OFF with respect to the high-level input voltage applied to the control gate. This operation corresponds to that of cutting off the fuse means F1 in the unit circuit including the MOSFET Q1 and the fuse means F1. On the other hand, the storage element into which no charge is injected is caused to have such a threshold voltage that it is ON with respect to the high-level input voltage applied to the control gate. This operation corresponds to that of not cutting off the fuse means F1 in the unit circuit including the MOSFET Q1 and the fuse means F1.

Charge is selectively injected into the floating agates of the nonvolatile storage elements M1–Mn to write the faulty address, the address signal is supplied to the control gate, and the drain is made in the wired logic structure, whereby this embodiment can operate similarly to the embodiment of FIG. 1.

A relatively high voltage is supplied to the control gate and the drain so as to write the aforementioned faulty address. More specifically, the voltage at the control gate is set to as high as about 12 V, a voltage of as high as about 10 V is applied to the drain, hot carriers are produced near the drain, and the hot carriers are injected into the floating gate, to perform the write operation.

Consequently, the address line to which the control gate is connected and the wired logic output line to which the drain is connected are provided with writing pads. In other words, the aforesaid high voltage is supplied by putting a probe to the pad to perform the selective write operation because it is only necessary for the faulty-address writing operation to be conducted at the probing step.

In addition, the defect may be redressed even after the device is packaged by providing built-in write circuits such as an EPROM or EEPROM.

Figure 4:
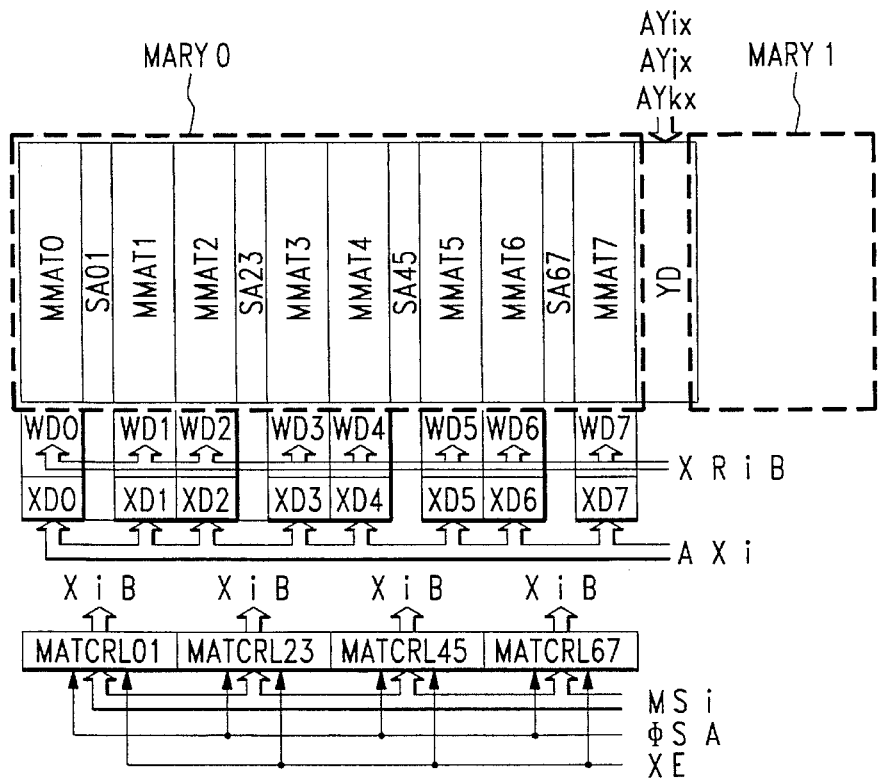
FIG. 4 is a block diagram showing a memory array and peripheral circuits in a dynamic RAM embodying the present invention.
Figure 5:
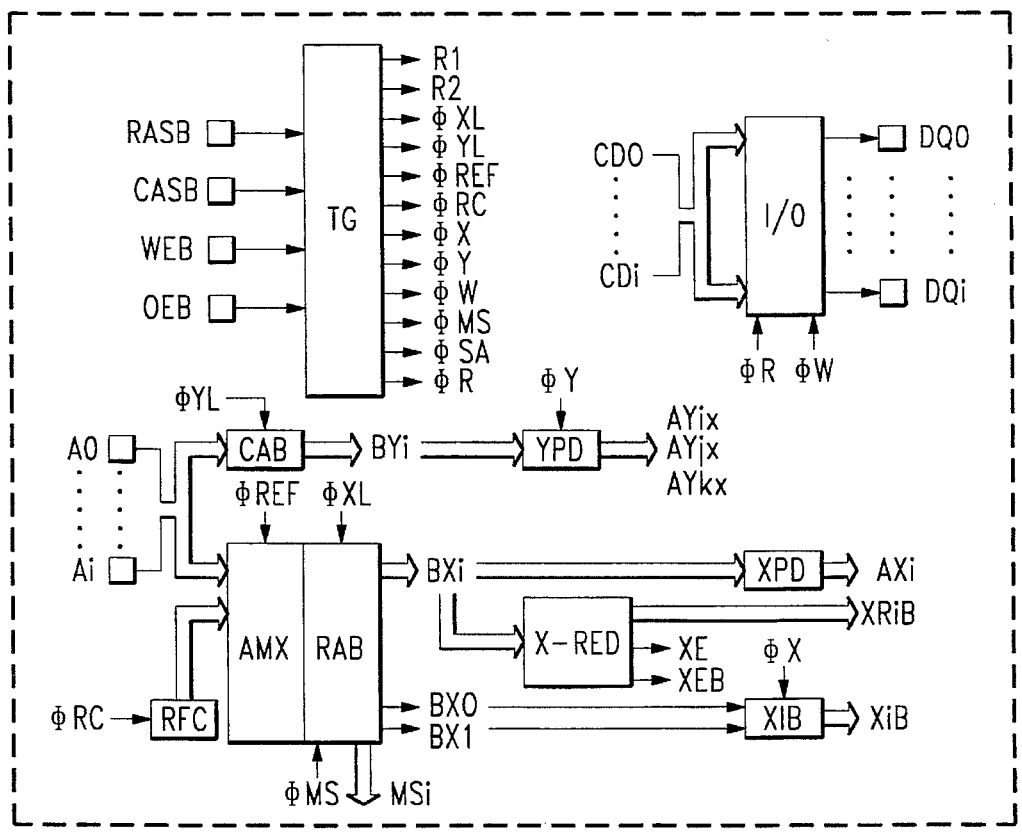
FIG. 5 is a block diagram showing an input/output interface and a timing control circuit in a dynamic RAM embodying the present invention.

FIGS. 4 and 5 are block diagrams of the essential parts of a dynamic RAM embodying the present invention. FIG. 4 shows a memory array and peripheral selection circuits. FIG. 5 shows an input/output interface unit including an address buffer and a data input/output buffer, together with a timing control circuit.

As shown in FIG. 4, a sense amplifier SA01 is provided in between two memory mats MAT0, MAT0. More specifically, the sense amplifier SA01 is of a shared sense type which is selectively used for the two memory mats MAT0, MAT1. A selection switch (not shown) is provided in the input/output parts of the sense amplifier SA01 and connected to the complementary bit lines of the memory mats MAT0, MAT1.

The remaining memory mats MAT2 and MAT3, MAT4 and MAT5, MAT6 and MAT7 are paired respectively and provided with sense amplifiers SA23, SA45 and SA67 commonly. Eight memory mats and four sense amplifiers in total constitute one memory array MARY0, and a Y decoder YD is provided in correspondence to the memory array MARY0. Further, a memory array 1 is symmetrically provided with the Y decoder YD interposed therebetween. Although the illustration of the internal structure is omitted, the memory array MARY1 is similar in structure to the memory array MARY0.

Decoders XD0–XD7 are provided for the respective memory mats MAT0–MAT7. These decoders XD0–XD7 decode an address signal AXi of the output signal of a predecoder circuit XPD and generate four word-line selecting signals. Further, there are provided word drivers WD0–WD7 for forming the word-line selecting signals by use of the output signals of the decoders XD0–XD7 and mat control circuits MATCTRL01–MATCTRL67 which will be described subsequently. The word drivers also include drivers corresponding to a spare word line for redressing a defect.

The mat control circuit MATCTRL01 corresponding to the pair of memory mats MAT0, MAT1 are provided. Similarly, the mat control circuits MATCTRL23, MATCTRL45, MATCTRL67 are provided for the other pairs of memory mats MAT2, MAT3–MAT6, MAT7. On receiving a mat selecting signal MSi, a signal XE and a sense operation timing signal φSA, and the decoded signal of a lower 2-bit address signal, one of the mat control circuits MATCTRL01–MATCTRL67, corresponding to the selected memory mat outputs a selection signal XiB for selecting one out of four word lines. In addition, in correspondence to the selected memory mat, the mat control circuit outputs a selection signal for keeping the ON state of the bit-line selecting switch corresponding to either the left or right selected memory mat and keeping the OFF state of the bit-line selecting switch corresponding to the unselected memory mat, and a timing signal for starting the amplification of the sense amplifier.

When access to a faulty word line is made, the operation of selecting the faulty word line is suspended because the low level of the signal XE formed by the decision circuit prohibits the selection signal XiB and so on from being output. Since the selection signal XRiB on the redundant circuit side is formed instead, the spare word line is selected.

As shown in FIG. 5, a timing control circuit TG judges the operating mode and correspondingly forms various timing signals necessary for the operation of the internal circuit on receiving a row address strobe signal RASB, a column address strobe signal CASB, a write enable signal WEB and an output enable signal OEB all supplied through external terminals. Each of the signals above is such that its low level is the active level.

Signals R1, R2 are internal timing signals of the row system. A timing signal φXL is provided for taking in and holding row system addresses and is supplied to a row address buffer RAB. That is, the row address buffer RAB receives the addresses from address terminals A0–Ai according to the timing signal φXL and causes a latch circuit to hold them.

A timing signal φYL is provided for taking in and holding column system addresses and is supplied to a column address buffer CAB. That is, the column address buffer RAB receives the addresses from the address terminals A0–Ai according to the timing signal φYL and causes a latch circuit to hold them.

A signal φREF is generated in a refresh mode and supplied to a multiplexer AMX provided at the input part of the row address buffer in order that the refresh address signal formed by a refresh address counter circuit RFC is used instead in the refresh mode. The refresh address counter circuit RFC counts refresh stepping pulses φRC formed by the timing control circuit TG and generates a refresh address signal.

A timing signal φX is a word-line selecting timing signal, which is supplied to a decoder XIB where four kinds of word-line selecting timing signals XiB are formed according to the decoded signal of the lower 2-bit address signal. A timing signal φY is a column selecting timing signal, which is supplied to a predecoder YPD of the column system where column selecting signals AYix, AYjx, AYkx are outputted.

A timing signal φW is a control signal for designating a write operation, whereas a timing signal φR is a control signal for designating a read operation. These timing signals φW, φR are supplied to an input/output circuit I/O and activate an input buffer included in the input/output circuit I/O when a write operation is conducted so as to put the output buffer in a high impedance output state. Contrarily, when a read operation is conducted, the timing signals φW, φR activate the output buffer to put the input buffer in a high impedance output impedance.

A timing signal φMS is a signal for executing the mat selecting operation and is supplied to the row address buffer RAB. The mat selecting signal MSi is output in synchronization with this timing. The timing signal φSA is a signal for instructing a sense amplifier to operate. This timing signal φSA is used for generating a sense-amplifier activating pulse and in addition a control signal for controlling the precharging termination of the complementary bit line and the cut-off of the bit line on the unselected memory mat side.

A redundant circuit X-RED of the row system is shown by way of example in this embodiment. In other words, the circuit X-RED includes storage circuits for storing faulty addresses and decision circuit for performing address comparison according to wired logic and judgment, as shown in FIG. 1 or 2. The cutting of the fuse means corresponding to the faulty address stored or writing data in the nonvolatile storage element is first compared with the internal address signal BXi outputted from the row address buffer RAB. When they disagree with each other, the signal XE is set to the high level and a signal XEB to a low level, so that the operation of the normal circuit is rendered effective. When the inputted internal address signal BXi agrees with the faulty address stored, the signal XE is set to the low level so as to prohibit the normal circuit from selecting the faulty word line, and the signal XEB is set to the high level so as to output the selection signal XRiB for selecting one spare word line.

Circuits similar to those of the row system are also provided in the column system, though they are not shown in FIG. 5. When access to the memory with respect to the faulty bit line is detected thereby, the operation of selecting the faulty bit line by the column decoder YD is suspended and a selection signal for selecting a spare bit line is formed instead.

The following effects are achievable by the embodiments of the invention.

(1) MOSFETs for causing current to flow through the pair of fuse means according to the complementary address signal are correspondingly provided at one end of the fuse means corresponding to each bit of the faulty address. The other end thereof is connected to the wired OR logic so as to form the decision signal. The fuse means corresponding to the MOSFET which is turned on by the faulty address signal is cut off to store the faulty address, whereby the faulty address storage and comparison parts can be formed. High speed operation is thus possible by switching the faulty circuit to a spare one while the normal decoder is operating.

(2) By vertically arranging unit circuits comprising the MOSFETs and the fuse means in the form of a matrix with the respect to the address input line, the density of their layout can be increased.

(3) By the use of nonvolatile storage elements high-speed operation and high-density layout can be realized similarly to the effects (1) and (2).

Figure 3:
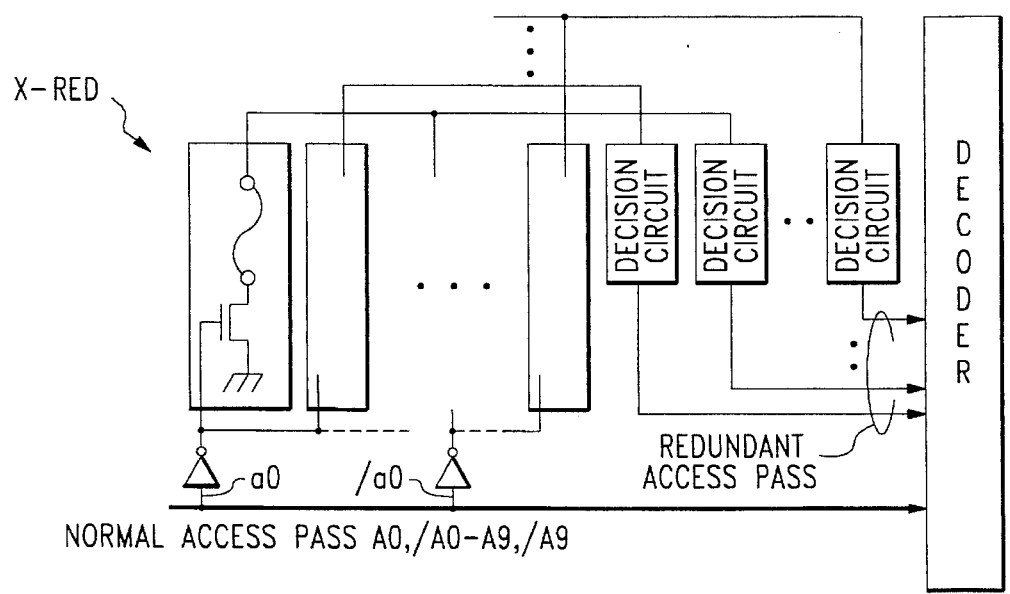
FIG. 3 is a partially schematic block diagram showing still another redundant circuit embodying the present invention.

A detailed description has been given of the preferred embodiments of the present invention. However, it will be understood that the embodiments of the present invention may be changed and modified without departing from the spirit and scope thereof. For example, a plurality of unit circuits, each comprising the fuse means and a MOSFET as shown in FIG. 3, may be arranged in a line. In this arrangement, positional control is simplified when a laser beam is applied to cut off the fuse means because they can be arranged in a line.

Referring to FIG. 4, four memory arrays together with Y decoders may be provided to form one dynamic RAM likewise. With four memory arrays used as a unit, moreover, four units of them may comprises a dynamic RAM. In this way, the actual memory array make-up of such a dynamic RAM may be diversified.

The present invention is also applicable to various ROMs other than dynamic and static RAMs. In other words, RAMs and ROMs may be incorporated in digital integrated circuits such as microcomputers in addition to those forming one integrated memory circuit.

In accordance with the invention, MOSFETs for causing current to flow through the pair of fuse means by the complementary address signal are correspondingly provided at one end of the fuse means corresponding to each bit of the faulty address. The other end is connected to a wired OR logic so as to generate a decision signal. The fuse means corresponding to the MOSFET which is turned on by the faulty address signal is cut off to store the faulty address, whereby the faulty address storage and comparison parts can be formed. High speed operation is thus possible by switching the faulty circuit to a spare one while the normal decoder is operating.

We claim:

1. A semiconductor storage device comprising a pair of fuses for each bit of an address signal, a MOSFET transistor connected to one end of each fuse for supplying each fuse with electric current, an inverter connecting each MOSFET transistor with the respective true and complement address signal for each fuse, the other end of each fuse for one set of address signals being connected together to form a wired OR configuration, and a decoder circuit for selecting between a normal storage circuit and a redundant circuit depending upon the condition of the signal on the wired OR configuration, the fuses being arranged in a linear matrix.

* * * * *